United States Patent [19]

Yang

[11] Patent Number: 5,296,410

[45] Date of Patent: Mar. 22, 1994

[54] METHOD FOR SEPARATING FINE PATTERNS OF A SEMICONDUCTOR DEVICE

[75] Inventor: Won-suk Yang, Kyungki, Rep. of Korea

[73] Assignee: Samsung Electronics Co., Ltd., Kyungki, Rep. of Korea

[21] Appl. No.: 992,963

[22] Filed: Dec. 16, 1992

[51] Int. Cl.$^5$ ............................................. H01L 21/316
[52] U.S. Cl. .................................. 437/228; 437/229; 437/233; 437/235
[58] Field of Search .............. 437/228, 233, 235, 238, 437/241, 229

[56] References Cited

U.S. PATENT DOCUMENTS

| | | | |
|---|---|---|---|
| 4,758,528 | 7/1988 | Goth et al. | 437/15 |
| 4,792,534 | 12/1988 | Tsuji et al. | 437/229 |
| 4,879,254 | 11/1989 | Tsuzuki et al. | 437/41 |
| 4,948,743 | 8/1990 | Ozaki | 437/40 |
| 4,997,790 | 3/1991 | Woo et al. | 437/195 |
| 5,173,437 | 12/1992 | Chi | 437/60 |
| 5,238,859 | 8/1993 | Kamiso et al. | 437/44 |

FOREIGN PATENT DOCUMENTS 2110876 6/1983 United Kingdom ................ 437/228

*Primary Examiner*—Olik Chaudhuri
*Assistant Examiner*—Ken Horton
*Attorney, Agent, or Firm*—Robert A. Westerlund; Charles R. Donohoe

[57] ABSTRACT

A method for forming a fine pattern of a semiconductor device, in which a first-to-be-patterned layer is formed on a semiconductor substrate, a photoresist film is coated on the first-to-be-patterned layer, and the photoresist film is patterned and cured to obtain a thermally stable photoresist film pattern. Thereafter, a second material layer is formed on the entire surface of the semiconductor substrate on which the photoresist film pattern is formed, by a low temperature plasma method, and the second material layer is anisotropically etched to thereby form a spacer made of the second material layer on the sidewalls of the photoresist film pattern. A first pattern is formed by anisotropically etching the first-to-be-patterned layer, using the spacer and the photoresist film pattern as an etching mask. The spacer and the photoresist film pattern are then removed. Using the first pattern thus obtained, a fine pattern which is the inverse of the first pattern can be formed. The separation interval between the individual elements can be reduced so as to be less than or equal to the minimum design rule, and a fine pattern below optical resolution can be attained.

11 Claims, 2 Drawing Sheets

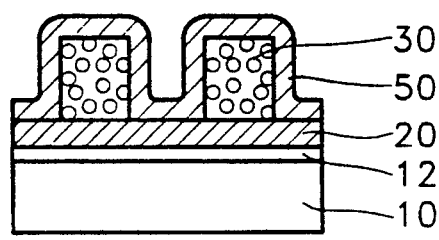
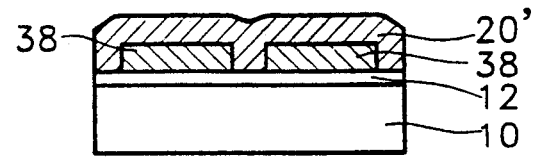
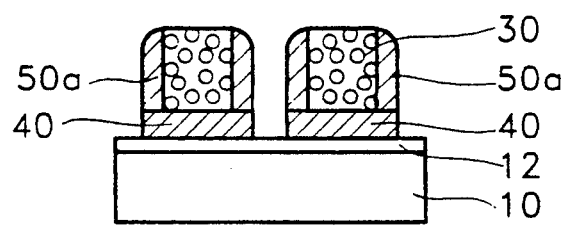
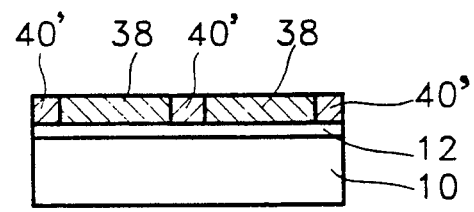
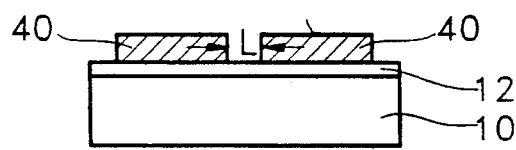
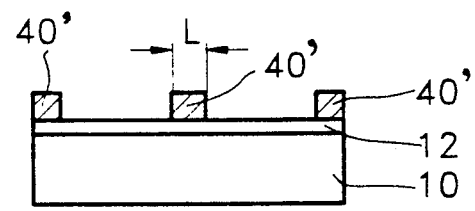
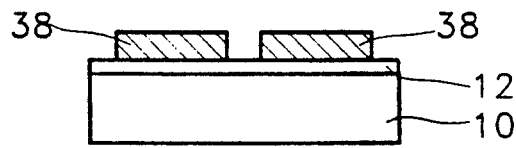
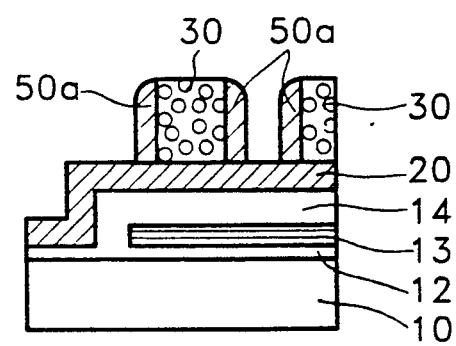

METHOD FOR SEPARATING FINE PATTERNS OF A SEMICONDUCTOR DEVICE

BACKGROUND OF THE INVENTION

The present invention relates generally to a method for manufacturing a semiconductor device, and more particularly, to a method for separating patterns and forming fine patterns of a semiconductor device, in which the distance between individual elements is reduced so as to be below the optical resolution.

The integration density of semiconductor memory devices (particularly, DRAM memories) has been progressively increasing by a factor of four approximately every four years. For example, while the four megabyte (4 Mb) DRAM is being mass-produced, the 16 Mb DRAM is being prepared for mass-production, and 64 Mb and 256 Mb DRAMs are in the stage of research and development. As a result of this quadrennial quadrupling of integration density, the actual area of the memory cells of such memory devices has been reduced by about 30%.

The higher integration density of semiconductor memory devices has been facilitated by two significant factors. More particularly, it has been facilitated by a decrease in the minimum design rule, which entails a reduction in the size of the features etched into the various layers of the semiconductor memory devices, i.e., the number of patterns which can be etched in a predetermined area is increased. In this regard, the reduction of the size of the pattern itself is significant. However, minimizing the distance between the patterns, that is, between individual elements, also contributes much to achievement of high integration density.

In 64 Mb and 256 Mb DRAMs, the separation interval between the individual elements should be reduced to about 0.1-0.5 µm. The separation intervals capable of being achieved by present optical resolutions vary depending upon the type of light used. However, the separation interval is generally about 0.4-0.6 µm. More particularly, the minimum design rule can be determined in accordance with the following equation (1):

$$Lm = \lambda/NA, \quad (1)$$

wherein Lm denotes the minimum linewidth, $\lambda$ is the wavelength of the light utilized in the photolithographic processes, and NA is the aperture ratio of the lens employed in the optics system. Most of the photolithographic equipment which is currently used in integration circuit processing utilizes ultraviolet rays ($\lambda = 0.2-0.4$ µm) as a light source, in which case the minimum linewidth can be reduced by increasing the aperture ratio of the lens. However, the minimum linewidth obtained by current technology is 0.4-0.6 µm.

FIGS. 1 to 3 are sectional views showing a conventional method of separating patterns of a semiconductor device, in which a photolithography process and etching process used for separating patterns (e.g., individual elements) are shown.

With reference to FIG. 1, an insulating interlayer 12 for isolating a semiconductor substrate 10 from a conductive layer, that is, from individual elements, is formed on the entire surface of substrate 10 and then, a first-to-be-patterned-layer 20, for example, a conductive material layer for forming the individual elements (i.e., DRAM word lines, bit lines, storage electrodes, etc.), is formed thereon.

With reference to FIG. 2, after a photoresist film is coated on the first-to-be-patterned-layer 20 by a spin coating method, a pattern-producing mask (not shown) is placed over the photoresist film. Subsequently, the mask is exposed to a light source, whereby a light-transmitting portion and a light-masking portion are produced on the photoresist film in accordance with the pattern formed on the mask. The light passing through the light-transmitting portion is projected on the photoresist film, thereby polymerizing the molecules of photoresist film (for negative photoresist film) and rendering them insoluble in a developer, or decomposing the molecules of the photoresist film (for positive photoresist film) and rendering them soluble in a developer. Subsequently, after removing the mask, the photoresist film is soaked in a developer, and the soluble portion of the photoresist film is removed and the insoluble portion of the photoresist film remains, to form a photoresist film pattern 30 as shown in FIG. 2. (This is a photolithography process.)

With reference to FIG. 3, a first pattern 22 is formed by anisotropically etching (for example, RIE etching) the first-to-be-patterned layer 20 using the photoresist film pattern 30 as an etching mask. (This is an etching process.)

In the above-described conventional method for separating individual elements of a semiconductor device, since distance L' between the patterns is determined in accordance with the resolution of the light (typically, ultraviolet rays) used as a light source, reduction of the distance L' is possible only by enhancing the optical resolution. Accordingly, the conventional method is not appropriate for the development of 64 Mb and 256 Mb DRAMs in which the distance between the patterns should be reduced to about 0.1 µm to 0.5 µm.

SUMMARY OF THE INVENTION

It is an object of the present invention to provide a method for separating patterns of a semiconductor device in which the distance between the individual elements is reduced to be below the optical resolution.

To achieve the above object of the present invention, there is provided a pattern separation method comprising the steps of:

forming a first-to-be-patterned layer on a semiconductor substrate;

coating a photoresist film on the first-to-be-patterned layer;

forming a thermally stable photoresist film be patterning and curing the photoresist film;

forming a second material layer on the entire surface of the semiconductor substrate on which the photoresist film pattern is formed, by a low temperature plasma method;

forming a spacer made of the second material layer on the sidewalls of the photoresist film pattern, by anisotropically etching the second material layer;

forming a first pattern by anisotropically etching the first-to-be-patterned layer using the spacer and the photoresist film pattern as an etching mask; and removing the spacer and the photoresist film pattern.

It is another object of the present invention to provide a method for forming fine patterns of a semiconductor device below the optical resolution.

To attain the other object of the present invention, there is provided a fine pattern forming method comprising the steps of:

forming a second-to-be-patterned layer on a semiconductor substrate;

coating a photoresist film on said second-to-be-patterned layer;

forming a thermally stable photoresist film pattern by patterning and curing the photoresist film;

forming a second material layer on the entire surface of the semiconductor substrate on which the photoresist film pattern is formed, by a low temperature plasma method;

forming a spacer made of the second material layer on the sidewalls of said photoresist film pattern, by anisotropically etching said second material layer;

forming a second pattern by anisotropically etching the second-to-be-patterned layer using the spacer and the photoresist film pattern as an etching mask;

removing the spacer and the photoresist film pattern;

forming a planarized first-to-be-patterned layer, over the entire surface of the semiconductor substrate on which the second pattern is formed; and forming a first pattern by etching-back the first-to-be-patterned layer until the surface of the second pattern is exposed.

The separation interval between the first patterns can be reduced to less than that of the minimum design rule and a fine pattern which is below the minimum design rule can be formed.

BRIEF DESCRIPTION OF THE DRAWINGS

The above objects and other advantages of the present invention will become more apparent with reference to the following detailed description of a preferred embodiment thereof with reference to the attached drawings in which:

FIGS. 4-6 are sectional views of one embodiment of a method for separating patterns of a semiconductor device according to the present invention;

FIGS. 7-10 are sectional views of one embodiment of a method for forming a fine pattern of a semiconductor device according to the present invention; and, FIG. 11 is a sectional view of a semiconductor device obtained by the method for separating patterns of a semiconductor device illustrated in FIGS. 4-6.

DESCRIPTION OF THE PREFERRED EMBODIMENT

Figure 1:
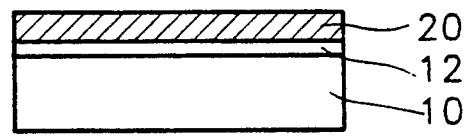
FIGS. 1-3 are sectional views showing a conventional method for separating elements of a semiconductor device.
Figure 2:
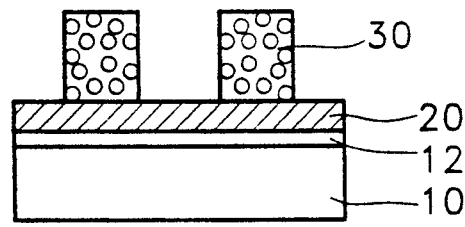
Figure 3:
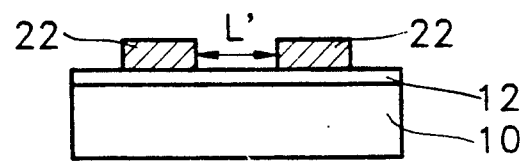

With reference now to FIG. 4, a step for forming second material layer 50 on the entire surface of semiconductor substrate 10 on which photoresist film pattern 30 has been formed, is shown. An insulating interlayer 12 for isolating semiconductor substrate 10 from a conductive layer, that is, individual elements, is formed on the entire surface of semiconductor substrate 10 and, then a first-to-be-patterned layer 20, for example, a conductive material layer for forming individual elements (i.e., DRAM word lines, bit lines, storage electrodes, etc.), is formed thereon. After a photoresist film is coated on first-to-be-patterned layer 20 by a spin coating method (generally coated to a thickness of 1.0–1.4 μm), the photoresist film is subject to a softbaking process.

Subsequently, photoresist film pattern 30 is formed by a photolithography process. More particularly, the photoresist film pattern 30 is hard-baked or ultraviolet-baked for 30 minutes at a temperature 120° C., to form a thermally stable photoresist film pattern up to a temperature of 250° C. Subsequently, second material layer 50, for example, PE-oxide, PE-TEOS oxide or PE-SiN film, is formed by a low temperature plasma method, on the entire surface of semiconductor substrate 10 on which the thermally stable photoresist film pattern 30 is formed, by a hard-baking or by an ultraviolet baking process. Since the second material layer 50 which is formed by the plasma method is formed at a temperature not more than about 200° C., the stability of the photoresist film pattern 30 can be maintained. This is possible by the plasma method which can form a certain material layer without directly applying heat to the semiconductor substrate 10. However, since formation of the film is possible only above a temperature of 500° C. by the conventional method, the shape of the photoresist film pattern 30 cannot be maintained in subsequent process steps. For example, polycrystalline silicon films are formed at temperatures above 570° C.

With reference to FIG. 5, wherein a step of forming spacer 50a and first pattern 40 is shown, since second material layer 50 is etched by an anisotropic etching process, for example, an RIE process, spacer 50a composed of the second material layer 50 is formed on the sidewalls of photoresist film pattern 30. Also, first-to-be-patterned layer 20 is partly removed by using the spacer 50a and the photoresist film pattern 30 as an etching mask, thereby forming a first pattern 40. Preferably, the second material layer 50 and the first-to-be-patterned layer 20 have an etching selectivity ratio of about 10 to 1, for stable pattern formation.

With reference to FIG. 6, wherein a step of leaving only first pattern 40 by removing spacer 50a and photoresist film pattern 30 is shown, the photoresist film pattern 30 is removed by an ashing or strip process. At this time, the photoresist film pattern 30 has an excellent etching selectivity ratio with respect to the other materials, so as to be easily removed without damaging the other materials. Also, spacer 50a is removed through an isotropic etching process having a high etching selectivity ratio with respect to the first-to-be-patterned layer 20. When the spacer 50a is formed of an oxide film and the first-to-be-patterned layer 20 is formed of polysilicon doped with impurities, if a stabilized buffered oxide etchant (SBOE), which is a mixture of a certain ratio of solutions such as NH$_4$F and HF, is used as the wet etchant, the etching selectivity ratio of the spacer 50a to the first-to-be-patterned layer 20 is about 10 to 1. Thus, the spacer 50a can be removed with little influence on the individual elements.

With this embodiment of a method for separating elements of the semiconductor device of the present invention, the separation interval between the first patterns 40 can be reduced to narrower than that of the minimum design rule (represented as "L" in FIG. 6). Also, this process is simpler than that of the conventional method. Even though a large step is formed in the substructure (see FIG. 11), since the height of a portion where the spacer is formed, that is, the height of the sidewall of the photoresist film pattern, is generally much higher than the above step, the generation of residue can be prevented in the substructure where the curvature is formed due to the step. (Generally, the step is 3,000 Å, while the height of the photoresist film pattern is 10,000–14,000 Å.)

FIGS. 7–10 are sectional views of one embodiment of a method for forming a fine pattern of a semiconductor device according to the present invention. More particularly FIGS. 7–10 depict a method for forming patterns less than or equal to the minimum design rule, using the second pattern formed in the above-described method for separating patterns.

With reference to FIG. 7, a second-to-be-patterned layer (not shown) is formed on semiconductor substrate 10 the surface of which is insulated from conductive layers, for example, individual elements, by insulating interlayer 12, having the same thickness as that of each individual element. The second-to-be-patterned layer is preferably made of an insulation material. A material having a large etching selectivity ratio with respect to the first-to-be-patterned layer in both dry and wet etching methods, is preferably used. Subsequently, second pattern 38 is formed through a photolithography and etching process.

With reference to FIG. 8, first-to-be-patterned layer 20' is formed on the entire surface of the semiconductor substrate on which the second pattern 38 is formed, so that the surface of the first-to-be-patterned layer 20' is planarized.

With reference to FIG. 9, first pattern 40' is formed between second patterns 38 by etching back the first-to-be-patterned layer 20' until the surface of second pattern 38 is exposed.

With reference to FIG. 10, since second pattern 38 is removed by the etchant of the second-to-be-patterned layer, only the first pattern 40' is left on the semiconductor substrate 10.

The above-described method for forming a fine pattern utilizes second pattern 38 which is formed by the previously described method for separating patterns to obtain the first pattern 40', which is the inverse of the second pattern 38. Accordingly, it is possible to form the first pattern 40' below the minimum design rule.

FIG. 11 is a sectional view of a semiconductor device which obtained by the method for separating patterns of a semiconductor device according to the present invention described hereinabove in conjunction with FIGS. 4–6.

Based upon the foregoing, it can now be appreciated that, with the present invention, the dimension of the individual elements of each pattern, and the separation interval between the individual elements, can be reduced so as to be less than or equal to the minimum design rule, which is limited by the optical resolution. Also, spacers can be formed on the sidewalls of the photoresist film pattern to simplify the process. In addition, the prior art problem of residue formation during the etching process is solved, thereby enabling the manufacture of a reliable, high-integration density semiconductor memory device.

Although the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A method for separating patterns of a semiconductor device, comprising the steps of:
    forming a first-to-be-patterned layer on a substrate;
    coating a photoresist film on said first-to-be-patterned layer;
    forming a thermally stable photoresist film pattern by patterning and curing said photoresist film;
    forming a second layer on the entire surface of said semiconductor substrate on which said photoresist film pattern is formed, by a low temperature plasma method;
    forming a spacer made of said second layer on the sidewalls of said photoresist film pattern, by anisotropically etching said second material layer;
    forming a first pattern by etching said first-to-be-patterned layer using an anisotropic etching method in which said spacer and said photoresist film pattern are used as an etching mask; and,
    removing said spacer and said photoresist film pattern.

2. A method for separating patterns of a semiconductor device as claimed in claim 1, wherein said step of curing said photoresist film is carried out by heat-treating said photoresist film for about 30 minutes at a temperature of 120° C.

3. A method for separating patterns of a semiconductor device as claimed in claim 1, wherein said photoresist film pattern is cured by an ultraviolet ray baking method.

4. A method for separating patterns of a semiconductor device as claimed in claim 1, wherein said second layer is comprised of a material selected from the group comprised of PE-oxide, PE-TEOS oxide and PE-SiN.

5. A method for separating patterns of a semiconductor device as claimed in claim 1, wherein said photoresist film has a thickness of about 1.0–1.4 μm.

6. A method for separating patterns of a semiconductor device as claimed in claim 1, wherein etching selectivity ratios of said spacer to said first-to-be-patterned layer and said first-to-be-patterned layer to said semiconductor substrate, are each at least 10:1.

7. A method for separating patterns of a semiconductor device as claimed in claim 1, wherein said second layer is an oxide layer and said first-to-be-patterned layer is a polycrystalline silicon layer.

8. A method for forming a fine pattern comprising the steps of:
    forming a second-to-be-patterned layer on a substrate;
    coating a photoresist film on said second-to-be-patterned layer;
    forming a thermally stable photoresist film pattern by patterning and curing said photoresist film;
    forming a second layer on the entire surface of said semiconductor substrate on which said photoresist film pattern is formed, by a low temperature plasma method;
    forming a spacer made of said second layer on the sidewalls of said photoresist film pattern, by anisotropically etching said second material layer;
    forming a second pattern by anisotropically etching said second-to-be-patterned layer using said spacer and said photoresist film pattern as an etching mask;
    removing said spacer and said photoresist film pattern;
    forming a planarized first-to-be-patterned layer, over the entire surface of said semiconductor substrate on which said second pattern is formed; and forming a first pattern by etching-back said first-to-be-patterned layer until the surface of said second pattern is exposed.

9. A method for forming a fine pattern as claimed in claim 8, wherein an etching selectivity ratio of said first-to-be-patterned layer with respect to said second-to-be-patterned layer is at least 10:1.

10. A method for forming a fine pattern as claimed in claim 8, wherein the etching selectivity ratios of said spacer to said second-to-be-patterned layer and said second-to-be-patterned layer to said semiconductor substrate, are each at least 10:1.

11. A method for forming a fine pattern as claimed in claim 8, wherein said second material layer is an oxide layer, said second-to-be-patterned layer is an insulation layer, and said first-to-be-patterned layer is a polycrystalline silicon layer.

* * * * *